US009422462B2

(12) United States Patent
Saito et al.

(10) Patent No.: US 9,422,462 B2
(45) Date of Patent: Aug. 23, 2016

(54) ADHESIVE SHEET

(75) Inventors: Takeshi Saito, Shibukawa (JP); Tomomichi Takatsu, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 362 days.

(21) Appl. No.: 14/128,493

(22) PCT Filed: May 28, 2012

(86) PCT No.: PCT/JP2012/063629
§ 371 (c)(1),
(2), (4) Date: Dec. 20, 2013

(87) PCT Pub. No.: WO2013/001959
PCT Pub. Date: Jan. 3, 2013

(65) Prior Publication Data
US 2014/0134431 A1    May 15, 2014

(30) Foreign Application Priority Data
Jun. 27, 2011 (JP) ................................. 2011-141506

(51) Int. Cl.
| B32B 27/08 | (2006.01) |
| B32B 27/22 | (2006.01) |
| B32B 27/30 | (2006.01) |
| C09J 7/02 | (2006.01) |
| C09J 133/06 | (2006.01) |
| C09J 133/08 | (2006.01) |
| H01L 21/683 | (2006.01) |
| C08L 33/08 | (2006.01) |
| C08K 5/00 | (2006.01) |
| C08K 5/11 | (2006.01) |
| C08K 5/12 | (2006.01) |

(52) U.S. Cl.
CPC .............. *C09J 7/0278* (2013.01); *C09J 7/0246* (2013.01); *C09J 133/08* (2013.01); *H01L 21/6836* (2013.01); *B32B 27/08* (2013.01); *B32B 27/22* (2013.01); *B32B 27/30* (2013.01); *C08K 5/0016* (2013.01); *C08K 5/11* (2013.01); *C08K 5/12* (2013.01); *C08L 33/08* (2013.01); *C08L 2205/02* (2013.01); *C09J 133/062* (2013.01); *C09J 2201/622* (2013.01); *C09J 2203/326* (2013.01); *C09J 2205/106* (2013.01); *C09J 2427/006* (2013.01); *C09J 2433/00* (2013.01); *H01L 2221/68327* (2013.01); *Y10T 428/2891* (2015.01)

(58) Field of Classification Search
None
See application file for complete search history.

(56) References Cited

U.S. PATENT DOCUMENTS

| 4,968,559 A * | 11/1990 | Kuroda ................... C09J 7/0217 |
| | | 257/E21.214 |
| 2008/0138618 A1 | 6/2008 | Sasaki et al. .................. 428/345 |
| 2010/0112272 A1 | 5/2010 | Hirano et al. ................... 428/77 |
| 2010/0233409 A1 | 9/2010 | Kamiya et al. ............... 428/41.5 |
| 2011/0104873 A1 | 5/2011 | Kamiya et al. ................ 438/464 |
| 2012/0000599 A1 * | 1/2012 | Takatsu ................... C09J 7/0217 |
| | | 156/248 |

FOREIGN PATENT DOCUMENTS

| JP | 6-61346 A | 3/1994 |
| JP | 11-158441 | 6/1999 |
| JP | 2001-89731 A | 4/2001 |
| JP | 2001-106990 A | 4/2001 |
| JP | 2008-143924 A | 6/2008 |
| JP | 2009-135377 A | 6/2009 |
| JP | 2009-170786 A | 7/2009 |
| JP | WO 2010106849 A1 * | 9/2010 ............. C09J 7/0217 |
| WO | WO 2008/047610 A1 | 4/2008 |

OTHER PUBLICATIONS

International Search Report mailed Jul. 17, 2012, issued in corresponding International Patent Application No. PCT/JP2012/063629.
Japanese Office Action dated Jun. 14, 2016, issued by the Japanese Patent Office in corresponding application JP 2013-522540.

* cited by examiner

*Primary Examiner* — Ramsey Zacharia
(74) *Attorney, Agent, or Firm* — Stein IP, LLC

(57) ABSTRACT

An adhesive sheet of the invention includes a substrate and an adhesive composition laminated thereon, the substrate including polyvinyl chloride and a polyester-based plasticizer, wherein the adhesive composition includes two different (meth)acrylate copolymer components (A) and (B) in a mass ratio ranging from 10:90 to 90:10, wherein a content of a cross-linking agent which reacts with functional groups of the component (A) and the component (B) is in a range of 0.5 to 20 mass parts with respect to 100 mass parts of a sum of the component (A) and the component (B), and wherein 10 to 95 mass % of the monomer unit composing the component (A) is 2-ethylhexyl acrylate, and 10 to 95 mass % of the monomer unit composing the component (B) is butyl acrylate.

4 Claims, No Drawings

ADHESIVE SHEET

CROSS-REFERENCE TO RELATED APPLICATIONS

This application is national stage of International Application No. PCT/JP2012/063629, filed May 28, 2012, which claims the benefit of Japanese Application No. 2011-141506, filed Jun. 27, 2011, in the Japanese Patent Office. All disclosures of the document(s) named above are incorporated herein by reference.

BACKGROUND OF THE INVENTION

1. Field of the Invention

The present invention relates to an adhesive sheet. More specifically, the present invention relates to an adhesive sheet used in manufacturing processes of electronic components, for dicing and/or conveying.

2. Description of the Related Art

A semiconductor wafer is generally fed, after being provided with circuits and then being attached with an adhesive sheet, to processes such as dividing into small pieces of elements (dicing), cleaning, drying, stretching the adhesive sheet (expanding), exfoliating the small pieces of elements from the adhesive sheet (picking up), and mounting. Patent Document 1 describes a substrate in which polyvinyl chloride is used, as an example of an adhesive sheet for dicing and/or conveying, used in these processes.

Further, in relation to the present invention, Patent Document 2 describes, as an adhesive composition, a composition in which two types of (meth)acrylate copolymers differing in weight-average molecular weight are used.

Further, Patent Document 3 describes a technique employing a polyester-based plasticizer in order to prevent loss of adhesive force with time in an adhesive sheet as a skin patch.

PRIOR ART DOCUMENTS

Patent Documents

Patent Document 1: Japanese laid-open patent publication No. H6-61336.
Patent Document 2: Japanese laid-open patent publication No. 2001-89731.
Patent Document 3: Japanese laid-open patent publication No. 2001-106990.

SUMMARY OF THE INVENTION

Problems to be Solved by the Invention

In the conventional adhesive sheets using polyvinyl chloride as a substrate, migration of plasticizer from the substrate to an adhesive layer occurs with time, causing problems of lowered chip-holding ability in a dicing process and poor chip-exfoliating ability (picking-up ability) in a picking-up process.

The present invention has been made in view of such circumstances, and the purpose thereof is to provide an adhesive sheet which does not suffer from deterioration with time in chip-holding ability in the dicing process nor chip-exfoliating ability in the picking-up process.

Means to Solve the Problem

According to the invention, there is provided an adhesive sheet for dicing and/or conveying, comprising a substrate and an adhesive composition laminated thereon, the substrate including polyvinyl chloride and a polyester-based plasticizer, wherein the adhesive composition includes a (meth) acrylate copolymer component (A) with a weight-average molecular weight lower than 350,000 having a functional group-containing monomer unit; and a (meth)acrylate copolymer component (B) with a weight-average molecular weight of 350,000 to 2,000,000 having a functional group-containing monomer unit, in a mass ratio ranging from 10:90 to 90:10, wherein a content of cross-linking agent which reacts with functional groups the component (A) and the component (B) is in a range of 0.5 to 20 mass parts with respect to 100 mass parts of a sum of the component (A) and the component (B), and wherein 10 to 95 mass % of the monomer unit composing the component (A) is 2-ethylhexyl acrylate, and 10 to 95 mass % of the monomer unit composing the component (B) is butyl acrylate.

The inventors firstly thought of using a polyester-based plasticizer as described in Patent Document 3 instead of conventionally used dioctyl phthalate and evaluate an increase in adhesive force with time. However, even in the case of using the polyester-based plasticizer, increase in adhesive force with time occurred so that no satisfactory result was obtained at least in one of the chip-holding ability and the picking-up ability.

Then the inventors further studied and found that the polyester-based plasticizer hardly migrates to an adhesive composition in which two types of (meth)acrylate copolymer components of the specific compositions and the molecular weights mentioned above are included in a specific ratio, and revealed that an adhesive sheet which does not suffer from deterioration with time in chip-holding ability in the dicing process and chip-exfoliating ability in the picking-up process can be obtained by combining a polyester-based plasticizer and such an adhesive composition, and thus, have arrived at the present invention.

Preferably, a content of the polyester-based plasticizer in the substrate is 20 to 50 mass parts with respect to 100 mass parts of polyvinyl chloride. Preferably, the polyester-based plasticizer is an adipic acid-based polyester.

Preferably, glass-transition temperatures of the component (A) and the component (B) are 0° C. or below.

Advantageous Effect of the Invention

According to the invention, an adhesive sheet is provided whose chip-holding ability in the dicing process and chip-exfoliating ability in the picking-up process do not deteriorate with time.

Additional aspects and/or advantages of the invention will be set forth in part in the description which follows and, in part, will be obvious from the description, or may be learned by practice of the invention.

DETAILED DESCRIPTION OF PREFERRED EMBODIMENTS

Hereinafter, preferred embodiments of the present will be described. It is to be appreciated that the embodiments described below are only exemplary embodiments of the present technology, and thus, they are not intended to limit the present invention.

Note that, in the specification, the term "monomer unit" means a structural unit derived from a monomer. The terms "part" and "%" are based on mass, unless otherwise specified. The term "(meth)acrylate" is used collectively so as to encompass both acrylate and methacrylate. Similarly, a compound name having a prefix of "(meth)" such as "(meth) acrylic acid" is used collectively so as to encompass both compounds with and without the prefix "meth".

1. Adhesive Sheet (1) Substrate

The adhesive sheet for dicing and/or conveying according to the present invention (hereafter, simply referred to as "adhesive sheet") comprises a substrate including polyvinyl chloride and a polyester-based plasticizer and an adhesive composition laminated on the substrate.

As the materials for the substrate, polyvinyl chloride, which is conventionally used widely as a substrate material in an adhesive sheet, can be employed. As a molding method of molding the substrate, for example, calendering, T-die extrusion, inflation or casting method can be employed.

The thickness of a substrate film is not specifically limited, and is, for example, from 40 to 250 µm, preferably from 50 to 200 µm, and more preferably from 60 to 150 µm.

Polyester is added as a plasticizer to polyvinyl chloride. Examples of the polyester-based plasticizer include, for example, polyesters resulting from polycondensation of a dicarboxylic acid such as an aliphatic dicarboxylic acid having two to ten carbon atoms and/or an aromatic dicarboxylic acid, such as adipic acid, azelaic acid, sebacic acid, phthalic acid, isophthalic acid, and terephthalic acid, and a glycol having two to ten carbon atoms, such as ethylene glycol, propylene glycol, butylene glycol, neopentyl glycol, and hexanediol.

As the dicarboxylic acid, an aliphatic dicarboxylic is preferable, such as adipic acid, sebacic acid and the like, especially adipic acid from the view point of general versatility, price and stability with time. As the glycol, both linear and branched glycols can be used, and proper one is selected as required. A glycol having two to six carbon atoms is preferable.

A number-average molecular weight of a polyester-based plasticizer is not specifically limited, and typically a polyester-based plasticizer having a molecular weight approximately ranging 500 to 4000 is used.

The content the polyester-based plasticizer is preferably 20 to 50 mass parts, more preferably 25 to 45 mass parts, and still more preferably 30 to 40 mass parts, relative to 100 mass parts of polyvinyl chloride.

By including the above-mentioned polyester as the plasticizer and using it in combination with an adhesive composition having the specific composition described later, it is possible to suppress migration of the plasticizer in the substrate into an adhesive layer so that the resulting adhesive sheet is provided with sufficient chip-holding ability in the dicing process and chip-exfoliating ability in the picking-up process.

The substrate film may include a variety of additives such as an antioxidant, an ultraviolet absorber, a light stabilizer, an antistat, a fire retardant, and a colorant such as a dye or a pigment. The content of such additives is not specifically limited, and can be arbitrarily determined.

As the antioxidant, any one known conventionally as an antioxidant in the field of resins or resin compositions may be employed, being not specifically limited. Examples of the antioxidant include, for example, phenol-based (monophenol-based, bisphenol-based, polymer-type phenol-based), sulfur-based, and phosphorus-based antioxidants.

Examples of the ultraviolet absorber include salicylate-based, benzophenone-based, benzotriazole-based and cyanoacrylate-based ultraviolet absorbers. From the view point of efficiency of ultraviolet absorption, a benzophenone-based ultraviolet absorber and a benzotriazole-based ultraviolet absorber are preferable, with a benzotriazole-based ultraviolet absorber especially preferable.

As the light stabilizer, for example, hindered amine-based and hindered phenol-based light stabilizers can be used.

Examples of the antistat include quaternary amine monomers and the like. Examples of the quaternary amine monomer include, for example, dimethylaminoethyl (meth)acrylate quaternary salt, diethylaminoethyl (meth)acrylate quaternary salt, methylethylaminoethyl (meth)acrylate quaternary salt, p-dimethylaminostyrene quaternary salt, and p-diethylaminostyrene quaternary salt, with dimethylaminoethyl methacrylate quaternary salt being preferably used. Note that antistatic treatment of the substrate can be performed also by applying an antistat onto the surface of the substrate.

Examples of the fire retardant include, for example, a bromine-based fire retardant; inorganic fire retardants such as aluminum hydroxide, magnesium hydroxide, antimony trioxide; and organic fire retardants such as melamine cyanurate, urea, triazine ring-containing compounds including melamine derivatives, and phosphates such as aromatic polyphosphates.

As the colorant, known or well known colorants can be used such as organic pigments, inorganic pigments, dyes, and carbon black. The color is arbitrary and, for example, white, ivory, black, red, blue, yellow, green or the like can be used. In the case of a multilayered film substrate, a colorant may be added either to all of the layers or to only part of the layers. Examples of the pigment include organic pigments such as phthalocyanine-based, azo-based, condensed azo-based, azo lake-based, anthraquinone-based, perylene/perinone-based, indigo/thioindigo-based, isoindolinone-based, azomethineazo-based, dioxazine-based, quinacridone-based, aniline black-based, triphenylmethane-based, and carbon black-based pigments; titanium oxide-based, iron oxide-based, iron hydroxide-based, chromium oxide-based, spinel-type sinter-based, chromic acid-based, chrome vermilion-based, Prussian blue-based, aluminum powder-based, and bronze powder-based pigments. These pigments can be subjected to a variety of dispersion treatments according to known techniques.

As for the substrate, in order to enhance ductility in the expanding process, a lubricant can be applied onto the surface thereof or kneaded therein. The lubricant is not limited to a specific substance as far as it is capable of lowering friction between the adhesive sheet and an expanding apparatus, and silicone compounds such as silicone resin and (modified) silicone oil, fluorine resin, hexagonal boron nitride, carbon black, or molybdenum disulfide can be used. Since production of electronic components are performed in a clean room, it is preferable to employ a silicone compound or a fluorine compound. Among the silicone compounds, copolymers having silicone macromonomer unit are particularly preferable since they have good compatibility with antistatics, thereby satisfying both antistatic performance and expandability.

While the adhesive layer described below is laminated on one side of the substrate, the other side may be subjected to embossing. Embossing is preferably performed such that an average surface roughness (Ra) of the substrate surface ranges from 0.3 to 1.5 µm. Arranging the adhesive sheet with the embossed side thereof facing the machine table side of the expanding apparatus facilitates expansion of the substrate in the expanding process.

(2) Adhesive Layer

An adhesive layer is laminated on one surface of the substrate. The adhesive layer is formed of an adhesive composition including two types of (meth)acrylate ester copolymers, in a predetermined ratio, each having a functional group-containing monomer unit and a weight-average molecular weight different from each other, as well as a cross-linking agent which reacts with the functional groups.

Specifically, the adhesive composition includes a (meth)acrylate copolymer component (A) with a weight-average molecular weight lower than 350,000 having a functional group-containing monomer unit; and a (meth)acrylate copolymer component (B) with a weight-average molecular weight of 350,000 to 2,000,000 having a functional group-containing monomer unit, in a mass ratio ranging from 10:90 to 90:10. Note that the "weight-average molecular weight" is a value measured by gel permeation chromatography (GPC) as a polystyrene-conversion average molecular weight.

In the case that the weight-average molecular weight of the component (A) is more than 350,000, wettability to an adherend is not sufficient, resulting in an insufficient chip-holding ability in the dicing process. If the weight-average molecular weight of the component (B) is less than 350,000, the adhesive force becomes too large with time after adhesion to the adherend, resulting in a poor chip-exfoliating ability in the picking-up process. Further, if the weight-average molecular weight of the component (B) is more than 2,000,000, wettability to the adherend is not sufficient, resulting in an insufficient chip-holding ability in the dicing process.

The weight-average molecular weight of the component (A) is, for example, 50,000, 100,000, 150,000, 200,000, 250,000, 300,000 or 340,000, and may also be a value in a range between any two of the above-exemplified values. The weight-average molecular weight of the component (B) is, for example, 350,000, 400,000, 500,000, 600,000, 700,000, 800,000, 900,000, 1,000,000, 1,100,000, 1,200,000, 1,300,000, 1,400,000, 1,500,000, 1,600,000, 1,700,000, 1,800,000, 1,900,000 or 2,000,000, and may also be a value in a range between any two of the above-exemplified values. The mass ratio of the component (A) and the component (B) is, for example, 10:90, 20:80, 30:70, 40:60, 50:50, 60:40, 70:30, 80:20 or 90:10, and may also be a value in a range between any two of the above-exemplified values.

As to the content ratio of the component (A) and the component (B), if the amount of the component (A) is too large or small, it is not possible to suppress spreading of wetting to an adherend with time.

As the functional group-containing monomer composing the component (A) and the component (B), a vinyl-compound monomer having one or more functional groups selected from the group consisting of hydroxyl, carboxyl, epoxy, amide, amino, methylol, sulfonic acid, sulfamic acid, phosphoric ester and phosphorous ester groups can be used.

Examples of the functional group-containing monomer having a hydroxyl group include 2-hydroxyethyl (meth)acrylate, 2-hydroxypropyl (meth)acrylate, 2-hydroxybutyl (meth)acrylate, and 2-hydroxyvinyl ether.

Examples of the functional group-containing monomer having a carboxyl group include (meth)acrylic acid, crotonic acid, maleic acid, maleic anhydride, itaconic acid, fumaric acid, acrylamide-N-glycolic acid, and cinnamic acid.

Examples of the functional group-containing monomer having an epoxy group include glycidyl (meth)acrylate.

Examples of the functional group-containing monomer having an amide group include (meth)acrylamide.

Examples of the functional group-containing monomer having an amino group include N,N-dimethylaminoethyl (meth)acrylate, N-t-butylaminoethyl (meth)acrylate.

Examples of the functional group-containing monomer having a methylol group include N-methylol(meth)acrylamide.

As the (meth)acrylate monomer composing the component (A) and the component (B) and capable of copolymerizing with the functional group-containing monomer noted above, butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth)acrylate, lauryl (meth)acrylate, methyl (meth)acrylate, ethyl (meth)acrylate, isopropyl (meth)acrylate, tridecyl (meth)acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxyethyl (meth)acrylate, ethoxyethyl (meth)acrylate, butoxymethyl (meth)acrylate, and ethoxy-n-propyl (meth)acrylate can be used.

In order to suppress spreading of wetting to an adherend with time, it is suitable that 10 to 95 mass % of the monomer unit composing the component (A) is 2-ethylhexyl acrylate and 10 to 95 mass % of the monomer unit composing the component (B) is butyl acrylate. Each of the ratios of 2-ethylhexyl acrylate and butyl acrylate is 10, 20, 30, 40, 50, 60, 70, 80, 90 or 95 mass %, and may also be a value in a range between any two of the above-exemplified values.

Glass-transition temperature of the component (A) and the component (B) is suitably 0° C. or below. Note that the value of "glass-transition temperature" is derived using the following "Gordon-Taylor equation":

$$W/Tg = W_1/Tg_1 + W_2/Tg_2 + W_n/Tg_n$$

where

Tg: glass-transition temperature of the (meth)acrylate copolymer, $Tg_n$: glass-transition temperature of the homopolymer of the n-th monomer, $W_n$: mass fraction (%) of the n-th monomer.

The cross-linking agent is not specifically limited as long as it reacts with the functional groups of the functional group-containing monomers composing the component (A) and the component (B), and can be, for example, an isocyanate compound, an epoxy compound, an imine compound and the like. These compounds may be used independently or in combination.

As the isocyanate compound, a compound having a plurality of isocyanate groups such as aromatic isocyanate, alicyclic isocyanate, and aliphatic isocyanate is used.

Examples of the aromatic isocyanate compound include tolylene diisocyanate, 4,4-diphenylmethane diisocyanate, and xylylene diisocyanate.

Examples of the alicyclic isocyanate compound include isophorone diisocyanate, methylenebis(4-cyclohexylisocyanate).

Examples of the aliphatic isocyanate compound include hexamethylene diisocyanate, and trimethylhexamethylene diisocyanate.

These isocyanate compounds may be a dimer or a trimer, and may be also an adduct obtained through a reaction of a polyol compound.

As the epoxy compound, a bisphenol A epoxy compound, a bisphenol F epoxy compound, N,N-glycidylaniline, N,N-glycidyltoluidine, m-N,N-glycidylaminophenyl glycidyl ether, p-N,N-glycidylaminophenyl glycidyl ether, triglycidyl isocyanurate, N,N,N',N'-tetraglycidyldiaminodiphenylmethane, N,N,N',N'-tetraglycidyl-m-xylenediamine, N,N,N',N',N''-pentaglycidylethylenetriamine, and the like are used.

As the imine compound, N,N'-diphenylmethane-4,4,'-bis(1-aziridinecarboxamide), trimethylolpropane-tri-β-aziridinyl propionate, tetramethylolmethane-tri-β-aziridinyl propionate, N,N'-toluene-2,4-bis-(1-aziridinecarboxamide) triethylenemelamine, and the like can be used.

The content of the cross-linking agent is in a range of 0.5 to 20 mass parts with respect to 100 mass parts of a sum of the component (A) and the component (B). In the case that the content of the cross-linking agent is lower than 0.5 mass parts, the adhesive force becomes too large, resulting in a poor chip-exfoliating ability in the picking-up process, and if the content of the cross-linking agent is higher than 20 mass parts, the adhesive force becomes too small, resulting in a poor chip-holding ability in the dicing process. The content of the cross-linking agent, with respect to 100 mass parts of the sum of the component (A) and the component (B), is, for example, 0.5, 1, 2, 4, 6, 8, 10, 12, 14, 16, 18 or 20 mass parts, and may also be a value in a range between any two of the above-exemplified values.

To the adhesive layer, a variety of additives such as a tackifier, a polymerization initiator, a hardener, a softener, an anti-aging agent, a filler, an ultraviolet absorber, a light stabilizer, a photopolymerizable compound, and a photo initiator may be added. As the tackifier, a rosin resin, a rosin ester resin, a terpene resin, a terpene phenol resin, a phenol resin, a xylene resin, a coumarone resin, a coumarone indene resin, a styrene resin, an aliphatic petroleum resin, an aromatic petroleum resin, an aliphatic-aromatic copolymer petroleum resin, an alicyclic hydrocarbon resin, and a modified product, a derivative or a hydrogenated product thereof and the like are used.

The content of the tackifier is not specifically limited, and is 200 mass parts or below, preferably 30 mass parts or below, with respect to 100 mass pats of the (meth)acrylate polymer.

2. Manufacturing Method of Adhesive Sheet

The adhesive sheet according to the present invention can be manufactured by laminating the adhesive composition on the substrate using a known method.

Examples of the method for forming the adhesive layer on the substrate include a method applying directly the adhesive composition onto the substrate using, for example, a gravure coater, a comma coater, a bar coater, a knife coater, or a roll coater, and a method applying the adhesive composition onto an exfoliatable film and drying, and thereafter pasting it on the substrate. Also, the adhesive layer may be printed on the substrate by relief printing, intaglio printing, planographic printing, flexographic printing, offset printing, screen printing or the like.

The thickness of the adhesive layer is not specifically limited, and is preferably 1 to 100 μm, more preferably 5 to 40 μm, after drying. If the adhesive layer is too thin, the adhesive force becomes too small, resulting in a poor chip-holding ability during dicing, or increased tendency of peeling off from a ring frame. If the adhesive layer is too thin, by contrast, the adhesive force becomes too large, resulting in a poor chip-exfoliating ability in the picking-up process.

EXAMPLES

Polyvinyl chloride, a plasticizer, a stabilizer, a pigment and a filler are kneaded together by a Banbury mixer, and then formed into a thickness of 70 μm through a calendering process, to produce a substrate. Type and content of the plasticizer are shown in Tables I and II. As the adipic acid-based polyester, POLYCIZER W-2310 (Dainippon Ink And Chemicals, Inc.; number-average molecular weight: 2,300) was used.

Next, a (meth)acrylate copolymer having the composition and molecular weight shown in Table III was provided, and the component (A), the component (B) and the cross-linking agent were mixed together according to Tables I and II, to produce an adhesive composition. The adhesive composition was applied onto an exfoliatable film made of PET such that the thickness of the adhesive composition was 10 μm after drying, and the exfoliatable film was laminated on the substrate, and thus, an adhesive sheet was obtained.

Cross-linking agent: a trimethylolpropane adduct of 2,4-tolylene diisocyanate (Nippon Polyurethane Industry Co., Ltd; CORONATE L-45E).

TABLE I

| | | | example | | | | | | |
|---|---|---|---|---|---|---|---|---|---|
| | | | 1 | 2 | 3 | 4 | 5 | 6 | 7 |
| substrate | resin (mass part) | polyvinyl chloride | 100 | 100 | 100 | 100 | 100 | 100 | 100 |
| | plasticizer (mass part) | adipic acid-based polyester | 35 | 25 | 45 | 20 | 50 | | 35 |
| | | terephthalic acid-based polyester | | | | | | 35 | |
| adhesive layer | (meth)acrylate copolymer component (A) (mass part) | A-1 | 50 | 50 | 50 | 50 | 50 | 50 | |
| | | A-2 | | | | | | | 50 |
| | | A-3 | | | | | | | |
| | | A-4 | | | | | | | |
| | | A-5 | | | | | | | |
| | weight-average molecular weight (×10$^4$) | | 15 | 15 | 15 | 15 | 15 | 15 | 10 |
| | glass-transition temperature (° C.) | | −20.6 | −20.6 | −20.6 | −20.6 | −20.6 | −20.6 | −20.6 |
| | 2-ethylhexyl acrylate (mass %) | | 55 | 55 | 55 | 55 | 55 | 55 | 55 |
| | (meth)acrylate copolymer component (B) (mass part) | B-1 | 50 | 50 | 50 | 50 | 50 | 50 | |
| | | B-2 | | | | | | | 50 |
| | | B-3 | | | | | | | |
| | | B-4 | | | | | | | |
| | | B-5 | | | | | | | |
| | weight-average molecular weight (×10$^4$) | | 80 | 80 | 80 | 80 | 80 | 80 | 150 |
| | glass-transition temperature (° C.) | | −39.4 | −39.4 | −39.4 | −39.4 | −39.4 | −39.4 | −39.4 |
| | butyl acrylate (mass %) | | 50 | 50 | 50 | 50 | 50 | 50 | 50 |
| | mass ratio of components (A):(B) | | 50:50 | 50:50 | 50:50 | 50:50 | 50:50 | 50:50 | 50:50 |
| | cross-linking agent (mass part) | | 10 | 10 | 10 | 10 | 10 | 10 | 10 |
| evaluation | adhesive force (N/20 mm) | | 0.80 | 0.75 | 0.85 | 0.75 | 0.85 | 0.80 | 0.60 |
| | increase of adhesive force with time | | A | A | A | A | A | B | A |
| | chip-holding ability | | A | A | A | A | A | A | A |
| | picking-up ability | | A | A | A | A | A | B | A |
| | overall | | A | A | A | A | A | B | A |

TABLE I-continued

| | | | example | | | | | | |
|---|---|---|---|---|---|---|---|---|---|
| | | | 8 | 9 | 10 | 11 | 12 | 13 | 14 |
| substrate | resin (mass part) | polyvinyl chloride | 100 | 100 | 100 | 100 | 100 | 100 | 100 |
| | plasticizer (mass part) | adipic acid-based polyester | 35 | 35 | 35 | 35 | 35 | 35 | 35 |
| | | terephthalic acid-based polyester | | | | | | | |
| adhesive layer | (meth)acrylate copolymer component (A) (mass part) | A-1 | | 85 | 15 | 50 | 50 | | |
| | | A-2 | | | | | | | |
| | | A-3 | 50 | | | | | | |
| | | A-4 | | | | | | 50 | |
| | | A-5 | | | | | | | 50 |
| | weight-average molecular weight (×10⁴) | | 30 | 15 | 15 | 15 | 15 | 15 | 15 |
| | glass-transition temperature (° C.) | | −20.6 | −20.6 | −20.6 | −20.6 | −20.6 | −8.4 | −62.9 |
| | 2-ethylhexyl acrylate (mass %) | | 55 | 55 | 55 | 55 | 55 | 15 | 90 |
| | (meth)acrylate copolymer component (B) (mass part) | B-1 | | 15 | 85 | 50 | 50 | | |
| | | B-2 | | | | | | | |
| | | B-3 | 50 | | | | | | |
| | | B-4 | | | | | | 50 | |
| | | B-5 | | | | | | | 50 |
| | weight-average molecular weight (×10⁴) | | 40 | 80 | 80 | 80 | 80 | 80 | 80 |
| | glass-transition temperature (° C.) | | −39.4 | −39.4 | −39.4 | −39.4 | −39.4 | −48.5 | −4.8 |
| | butyl acrylate (mass %) | | 50 | 50 | 50 | 50 | 50 | 90 | 15 |
| | mass ratio of components (A):(B) | | 50:50 | 85:15 | 15:85 | 50:50 | 50:50 | 50:50 | 50:50 |
| | cross-linking agent (mass part) | | 10 | 10 | 10 | 1 | 18 | 10 | 10 |
| evaluation | adhesive force (N/20 mm) | | 1.00 | 1.00 | 0.70 | 1.00 | 0.60 | 0.60 | 1.10 |
| | increase of adhesive force with time | | A | A | A | A | A | A | A |
| | chip-holding ability | | A | A | A | A | A | A | A |
| | picking-up ability | | A | A | A | A | A | A | A |
| | overall | | A | A | A | A | A | A | A |

TABLE II

| | | | comparative example | | | | | | | | | |
|---|---|---|---|---|---|---|---|---|---|---|---|---|
| | | | 1 | 2 | 3 | 4 | 5 | 6 | 7 | 8 | 9 | 10 |
| substrate | resin (mass part) | polyvinyl chloride | 100 | 100 | 100 | 100 | 100 | 100 | 100 | 100 | 100 | 100 |
| | plasticizer (mass part) | adipic acid-based polyester | | 35 | 35 | 35 | 35 | 35 | 35 | 35 | 35 | 35 |
| | | dioctyl phthalate | 35 | | | | | | | | | |
| adhesive layer | (meth)acrylate copolymer component (A) (mass part) | A-1 | 50 | | 50 | 50 | 5 | 95 | | 50 | 50 | 50 |
| | | A-6 | | | | | | | 50 | | | |
| | | A-7 | | 50 | | | | | | | | |
| | weight-average molecular weight (×10⁴) | | 15 | 50 | 15 | 15 | 15 | 15 | 15 | 15 | 15 | 15 |
| | glass-transition temperature (° C.) | | −20.6 | −20.6 | −20.6 | −20.6 | −20.6 | −20.6 | 4.63 | −20.6 | −20.6 | −20.6 |
| | 2-ethylhexyl acrylate (mass %) | | 55 | 55 | 55 | 55 | 55 | 55 | 2 | 55 | 55 | 55 |
| | (meth)acrylate copolymer component (B) (mass part) | B-1 | 50 | 50 | | | 95 | 5 | 50 | | 50 | 50 |
| | | B-6 | | | | | | | | 50 | | |
| | | B-7 | | | 50 | | | | | | | |
| | | B-8 | | | | 50 | | | | | | |
| | weight-average molecular weight (×10⁴) | | 80 | 80 | 20 | 220 | 80 | 80 | 80 | 5.15 | 80 | 80 |
| | glass-transition temperature (° C.) | | −39.4 | −39.4 | −39.4 | −39.4 | −39.4 | −39.4 | −39.4 | 5.15 | −39.4 | −39.4 |
| | butyl acrylate (mass %) | | 50 | 50 | 50 | 50 | 50 | 50 | 50 | 2 | 50 | 50 |
| | mass ratio of components (A):(B) | | 50:50 | 50:50 | 50:50 | 50:50 | 5:95 | 95:5 | 50:50 | 50:50 | 50:50 | 50:50 |
| | cross-linking agent (mass part) | | 10 | 10 | 10 | 10 | 10 | 10 | 10 | 10 | 0.1 | 25 |
| evaluation | adhesive force (N/20 mm) | | 0.90 | 0.30 | 1.20 | 0.30 | 0.50 | 1.00 | 1.00 | 0.90 | 1.20 | 0.30 |
| | increase of adhesive force with time | | C | B | B | B | B | B | B | B | B | A |
| | chip-holding ability | | A | B | A | B | B | A | A | A | A | B |
| | picking-up ability | | C | A | B | A | B | B | B | B | B | A |
| | overall | | C | B | B | B | B | B | B | B | B | B |

TABLE III

| | | (meth)acrylate copolymer component (A) | | | | | | | (meth)acrylate copolymer component (B) | | | | | | | |
|---|---|---|---|---|---|---|---|---|---|---|---|---|---|---|---|
| | | A-1 | A-2 | A-3 | A-4 | A-5 | A-6 | A-7 | B-1 | B-2 | B-3 | B-4 | B-5 | B-6 | B-7 | B-8 |
| composition (mass part) | 2-ethylhexyl acrylate | 55 | 55 | 55 | 15 | 90 | 2 | 55 | | | | | | | | |
| | methyl methacrylate | 40 | 40 | 40 | | 5 | | 40 | | | | | 5 | | | |
| | 2-hydroxyethy acrylate | 5 | 5 | 5 | 5 | 5 | 5 | 5 | 5 | 5 | 5 | 5 | 5 | 5 | 5 | 5 |
| | methyl acrylate | | | | 80 | | 93 | | | | | | 80 | 93 | | |
| | ethyl acrylate | | | | | | | | 45 | 45 | 45 | | | | 45 | 45 |
| | butyl acrylate | | | | | | | | 50 | 50 | 50 | 90 | 15 | 2 | 50 | 50 |

TABLE III-continued

| | (meth)acrylate copolymer component (A) | | | | | | | (meth)acrylate copolymer component (B) | | | | | | | |
|---|---|---|---|---|---|---|---|---|---|---|---|---|---|---|---|
| | A-1 | A-2 | A-3 | A-4 | A-5 | A-6 | A-7 | B-1 | B-2 | B-3 | B-4 | B-5 | B-6 | B-7 | B-8 |
| glass-transition temperature (° C.) | −20.6 | −20.6 | −20.6 | −8.4 | −62.9 | 4.6 | −20.6 | −39.4 | −39.4 | −39.4 | −48.5 | −4.8 | 5.2 | −39.4 | −39.4 |
| weight-average molecular weight (×10$^4$) | 15 | 10 | 30 | 15 | 15 | 15 | 50 | 80 | 150 | 40 | 80 | 80 | 80 | 20 | 220 |

The obtained adhesive sheet was evaluated in the following respects. The results are shown in Tables I to II.

(1) Adhesive Force

The adhesive sheet was attached on a mirror surface of a silicon wafer, and pressure bonded by means of one reciprocating motion of a roller with a weight of 2 kg, and the adhesive force was measured after 20 minutes under the condition of 180° peeling and tension rate of 300 mm/min. As the silicon wafer, a wafer with a thickness of 725 µm (6 inch) was used.

(2) Increase of Adhesive Force with Time

A test sample which was left for twenty minutes after pressure bonding under the above-mentioned condition and a test sample which was left for seven days after pressure bonding were prepared, and an adhesive force was measured for each sample. An increasing rate was determined based on the adhesive force (X) of the test sample left for twenty minutes and the adhesive force (Y) of the test sample left for seven days according to the following formula:

Increasing rate=$(100(Y-X))/X$.

Based on the calculated increasing rate, the increase of adhesive force with time was evaluated according to the following criteria:

A: the increasing rate was less than 5%,
B: the increasing rate was 5% or more and less than 10%,
C: the increasing rate was 10% or more.

(3) Chip-Holding Ability

When the silicon wafer with the adhesive sheet attached was diced, the number of chips held on the adhesive sheet was counted. Following apparatus was used for the dicing. Cutting depth to the adhesive sheet was 30 µm, and chip size was 3 mm square.

Apparatus: DISCO Corporation, DAD341,
Dicing blade: DISCO Corporation, G1A851SD400R13B01,
Rotation speed of dicing blade: 40,000 rpm,
Feeding speed of dicing blade: 40 mm/sec,
Temperature of cutting water: 25° C.,
Amount of cutting water: 1.0 L/min.

Chip-holding ability was evaluated based on the number of chips according to the following criteria:

A: 95% or more of the chips were held on the adhesive sheet,
B: 80% or more of the chips were held on the adhesive sheet,
C: less than 80% of the chips were held on the adhesive sheet.

(4) Picking-Up Ability

After dicing the silicon wafer under the above-mentioned condition, picking up was performed under the following condition, and the number of chips having been picked up successfully was determined.

Picking up apparatus: CANON Machinery Inc., CAP-300II,
Amount of expansion: 5 mm,
Shape of needle pins: 150 µmR,
Number of needle pins: 4,
Upthrust height of needle pins: 0.3 mm.

Picking-up ability was evaluated based on the number of chips picked up successfully according to the following criteria:

A: 90% or more of the chips were picked up,
B: 80% or more of the chips were picked up,
C: less than 80% of the chips were picked up.

DISCUSSION

In all the examples where an adipic acid-based polyester was used as the plasticizer, the increase of adhesive force with time was small, so that the chip-holding ability and the picking-up ability were excellent. In Example 6 where a terephthalic acid-based polyester was used as the plasticizer, the increase of adhesive force with time occurred but a better result was obtained than in the case where dioctyl phthalate was used (Comparative Example 1).

In Comparative Examples 2 to 10, in spite of the fact that an adipic acid-based polyester was used as the plasticizer, good results could not be obtained since property or content of the copolymer component composing the adhesive layer or the cross-linking agent was not appropriate.

INDUSTRIAL APPLICABILITY

The adhesive sheet according to the present invention is excellent in chip-holding ability in the dicing process and chip-exfoliating ability in the picking-up process, so that it is suitable for use in producing electronic components, as an adhesive sheet for dicing and/or conveying.

Although a few embodiments of the present invention have been shown and described, it would be appreciated by those skilled in the art that changes may be made in this embodiment without departing from the principles and spirit of the invention, the scope of which is defined in the claims and their equivalents.

The invention claimed is:

1. An adhesive sheet for dicing and/or conveying, comprising a substrate and an adhesive composition laminated thereon, the substrate including polyvinyl chloride and a polyester-based plasticizer,
wherein said adhesive composition includes a (meth)acrylate copolymer component (A) with a weight-average molecular weight lower than 350,000 having a functional group-containing monomer unit; and a (meth)acrylate copolymer component (B) with a weight-average molecular weight of 350,000 to 2,000,000 having a functional group-containing monomer unit, in a mass ratio ranging from 10:90 to 90:10, wherein a content of a cross-linking agent which reacts with functional groups of said component (A) and said component (B) is in a range of 0.5 to 20 mass parts with respect to 100 mass parts of a sum of said component (A) and said component (B), and
wherein 10 to 95 mass % of said monomer unit composing said component (A) is 2-ethylhexyl acrylate, and 10 to 95 mass % of said monomer unit composing said component (B) is butyl acrylate.

2. An adhesive sheet of claim 1, wherein a content of said polyester-based plasticizer in said substrate is 20 to 50 mass parts with respect to 100 mass parts of polyvinyl chloride.

3. An adhesive sheet of claim 1, wherein said polyester-based plasticizer is an adipic acid-based polyester.

4. An adhesive sheet of claim 1, wherein glass-transition temperatures of said component (A) and said component (B) are 0° C. or below.

* * * * *